(12) United States Patent
Gerken et al.

(10) Patent No.: US 9,998,118 B2
(45) Date of Patent: Jun. 12, 2018

(54) SHEET WITH INTEGRATED SENSOR SYSTEM

(71) Applicant: Benecke-Kaliko AG, Hannover (DE)

(72) Inventors: Andreas Gerken, Hannover (DE); Jürgen Bühring, Wedemark (DE); Günter Leo Prömpers, Garbsen (DE)

(73) Assignee: Benecke-Kalico AG, Hannover (DE)

( * ) Notice: Subject to any disclaimer, the term of this patent is extended or adjusted under 35 U.S.C. 154(b) by 0 days. days.

(21) Appl. No.: 15/317,946

(22) PCT Filed: Mar. 23, 2015

(86) PCT No.: PCT/EP2015/056030
§ 371 (c)(1),
(2) Date: Dec. 11, 2016

(87) PCT Pub. No.: WO2015/188955
PCT Pub. Date: Dec. 17, 2015

(65) Prior Publication Data
US 2017/0126228 A1    May 4, 2017

(30) Foreign Application Priority Data

Jun. 12, 2014  (DE) ........................ 10 2014 211 239

(51) Int. Cl.
*H03K 17/96* (2006.01)
*G06F 3/044* (2006.01)

(52) U.S. Cl.
CPC ........... *H03K 17/962* (2013.01); *G06F 3/044* (2013.01); *G06F 2203/04102* (2013.01); *H03K 2217/960755* (2013.01)

(58) Field of Classification Search
CPC ...... H03K 17/955; H03K 17/962; G06F 1/16; G06F 3/01; G06F 3/02; G06F 3/33; G06F 3/41; G06F 3/44
(Continued)

(56) References Cited

U.S. PATENT DOCUMENTS 3,797,630 A * 3/1974 Zilkha ........................ B41J 5/08
                                                     235/145 R
4,367,385 A * 1/1983 Frame .................. H01H 13/702
                                                     200/292
(Continued)

FOREIGN PATENT DOCUMENTS

DE    102006008385 A1    8/2007
DE    102011006402 A1    10/2012
(Continued)

*Primary Examiner* — Xiaoliang Chen
(74) *Attorney, Agent, or Firm* — David L. Cate

(57) ABSTRACT

Flexible sheet made of polymer material, preferably a plastics-material sheet provided with a grain structure or embossing, which has functional surface-area regions designed in the form of a switching, sensor or operating element such that the sheet is of multi-layered design at least in the region of the functional surface-area regions, wherein at least one layer made of conductive polymer material is arranged in the functional surface-area regions, wherein the layer made of conductive material is spaced apart, on the rear side, from the visible surface of the sheet and is connected to an electronic control and regulating device, which detects changes in electrical properties of the sheet in the functional surface-area regions and converts these into actuating, switching or control signals.

10 Claims, 2 Drawing Sheets

Figure 1:
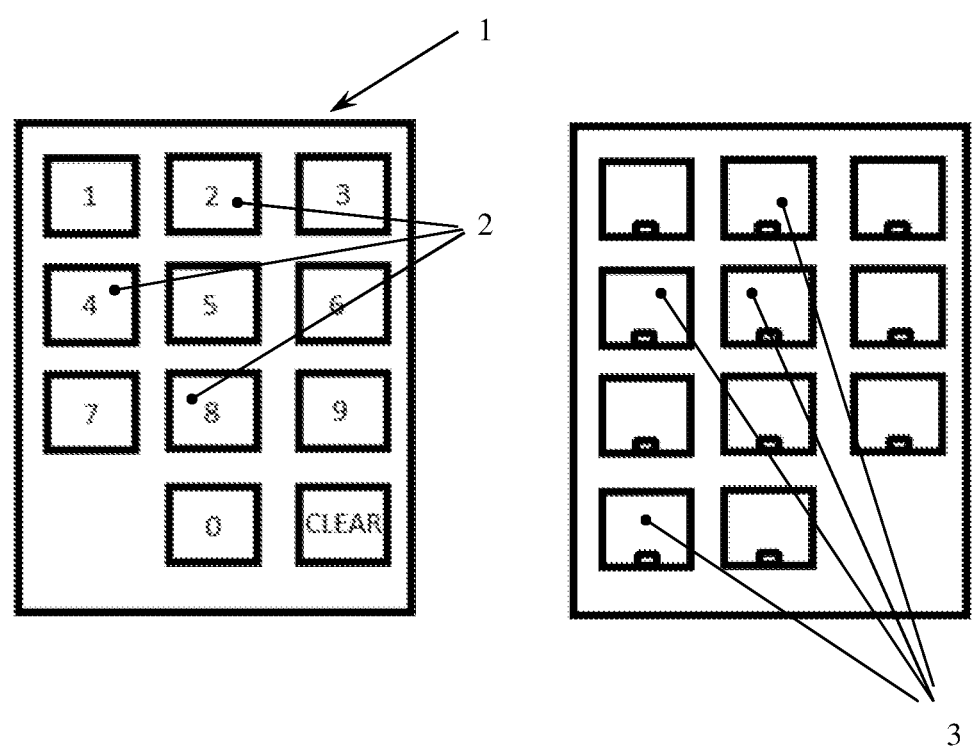

(58) Field of Classification Search
USPC ....... 361/749, 212, 288, 679.21; 341/20, 22, 341/26, 33, 34; 200/5 A, 52 R, 292, 305, 200/512, 516, 521, 600; 174/54, 258, 174/262; 345/168, 173, 174, 207
See application file for complete search history.

(56) References Cited

U.S. PATENT DOCUMENTS

| | | | | |
|---|---|---|---|---|
| 4,393,092 A * | 7/1983 | Gill | ............... | B05D 3/04 204/192.34 |
| 4,458,969 A * | 7/1984 | Demeo | ............... | H01H 13/702 29/622 |
| 4,504,709 A * | 3/1985 | Gandrud | ............... | H01H 13/702 200/5 A |
| 4,562,315 A * | 12/1985 | Aufderheide | ............... | H03K 17/9622 200/5 A |
| 4,714,631 A * | 12/1987 | Aufderheide | ............... | B05D 1/327 204/192.14 |
| 4,795,861 A * | 1/1989 | O'Rourke | ............... | H01H 13/702 174/255 |
| 4,818,827 A * | 4/1989 | Ipcinski | ............... | G09B 5/062 178/18.01 |
| 4,952,783 A * | 8/1990 | Aufderheide | ............... | G02B 27/0006 219/528 |
| 4,954,823 A * | 9/1990 | Binstead | ............... | H03K 17/9622 341/26 |
| 5,356,296 A * | 10/1994 | Pierce | ............... | A63H 33/38 434/317 |
| 5,399,823 A * | 3/1995 | McCusker | ............... | A61M 5/14244 200/512 |
| 5,401,926 A * | 3/1995 | Aoyama | ............... | H05F 3/02 200/305 |
| 5,414,420 A * | 5/1995 | Puckette | ............... | G01D 5/25 200/600 |
| 5,428,355 A * | 6/1995 | Jondrow | ............... | G01D 5/25 341/20 |
| 5,723,834 A * | 3/1998 | Hambleton, Jr. | ............... | B60Q 5/003 200/61.08 |
| 5,942,733 A * | 8/1999 | Allen | ............... | G06K 9/00335 178/18.01 |
| 5,949,029 A * | 9/1999 | Crotzer | ............... | B32B 27/08 174/254 |
| 6,271,482 B1 * | 8/2001 | Crotzer | ............... | H01H 1/029 174/262 |
| 6,529,122 B1 * | 3/2003 | Magnussen | ............... | G01L 1/205 200/511 |
| 7,982,380 B2 * | 7/2011 | Kamiyama | ............... | G02B 5/02 313/111 |
| 9,423,418 B2 * | 8/2016 | Alameh | ............... | G01D 5/24 |
| 9,583,516 B2 * | 2/2017 | Yamazaki | | |
| 2001/0013697 A1 * | 8/2001 | Saito | ............... | G01V 3/088 280/735 |
| 2002/0011978 A1 * | 1/2002 | Yamazaki | ............... | G09G 3/30 345/87 |
| 2004/0112732 A1 * | 6/2004 | Bergstedt | ............... | H01H 50/005 200/511 |
| 2005/0146510 A1 * | 7/2005 | Ostergard | ............... | G06F 3/044 345/173 |
| 2005/0219228 A1 * | 10/2005 | Alameh | ............... | G06F 1/1626 345/173 |
| 2006/0284836 A1 * | 12/2006 | Philipp | ............... | G06F 3/044 345/156 |
| 2007/0262836 A1 * | 11/2007 | Voss | ............... | H01P 3/081 333/247 |
| 2008/0142352 A1 * | 6/2008 | Wright | ............... | G06F 3/044 200/600 |
| 2008/0150657 A1 * | 6/2008 | Savic | ............... | H01G 5/18 333/262 |
| 2008/0202824 A1 * | 8/2008 | Philipp | ............... | G06F 3/02 178/18.01 |
| 2009/0015440 A1 * | 1/2009 | Patterson | ............... | H01H 3/141 341/34 |
| 2010/0079404 A1 * | 4/2010 | Degner | ............... | G06F 3/03547 345/174 |
| 2010/0196655 A1 * | 8/2010 | Kai | ............... | G02B 1/11 428/110 |
| 2010/0238119 A1 * | 9/2010 | Dubrovsky | ............... | G06F 1/1626 345/169 |
| 2010/0311494 A1 * | 12/2010 | Miller | ............... | A63F 1/18 463/22 |
| 2010/0312625 A1 * | 12/2010 | Miller | ............... | A63F 1/02 705/14.5 |
| 2011/0012845 A1 * | 1/2011 | Rothkopf | ............... | G06F 3/044 345/173 |
| 2011/0095877 A1 * | 4/2011 | Casparian | ............... | G06F 3/016 340/407.2 |
| 2011/0102326 A1 * | 5/2011 | Casparian | ............... | G06F 3/016 345/168 |
| 2012/0105400 A1 * | 5/2012 | Mathew | ............... | H04N 5/2251 345/207 |
| 2012/0106063 A1 * | 5/2012 | Mathew | ............... | G02F 1/133528 361/679.21 |
| 2012/0227259 A1 * | 9/2012 | Badaye | ............... | G06F 3/044 29/846 |
| 2014/0118826 A1 * | 5/2014 | Jiao | ............... | G02B 5/30 359/491.01 |
| 2014/0210784 A1 * | 7/2014 | Gourevitch | ............... | H03K 17/962 345/174 |
| 2015/0115259 A1 * | 4/2015 | Yamazaki | ............... | H01L 27/1225 257/43 |
| 2015/0155363 A1 * | 6/2015 | Nakazawa | ............... | H01L 29/45 257/43 |
| 2016/0070349 A1 * | 3/2016 | Marrs | ............... | G06F 3/023 345/173 |
| 2016/0250830 A1 * | 9/2016 | Kiya | ............... | B32B 27/30 174/258 |

FOREIGN PATENT DOCUMENTS

| | | |
|---|---|---|
| EP | 1626331 A2 | 2/2006 |
| JP | 2009212031 A | 9/2009 |
| WO | 2013013905 A1 | 1/2013 |
| WO | 2014001843 A1 | 1/2014 |

* cited by examiner

SHEET WITH INTEGRATED SENSOR SYSTEM

The invention relates to a flexible sheet-like material, preferably a sheet of plastic provided with a grain structure or embossing and made of polymeric material, the sheet-like element having functional surface-area regions, which are designed in the form of a switching, sensor or operating element, the sheet-like element as a whole being of a single- or multi-layered design, at least however in the region of the functional surface-area regions being of a multi-layered design.

Such sheet-like materials are known in the form of coatings on a large number of items. Thus, for example, dashboards, seat covers and door linings for motor vehicles have leather or textile covers, or else imitation-leather interior trims/plastic interior trims with three-dimensionally embossed surfaces or a grain structure. Surfaces of pieces of furniture or other items of daily use, PC or office-machine housings and telephones, etc., are also often provided with a flexible sheet-like material or with a grained/embossed sheet of plastic, to name just a few examples.

Sheets for the interior trim of motor vehicles, for furniture, bags or the like, commonly also referred to as imitation leather, are also known and often have a multi-layered structure, are often foam-backed and show on their upper side three-dimensionally structured surfaces of a wide variety of forms and configurations. The multi-layered structure generally consists of an upper top layer or decorative layer, which is provided with the embossed or impressed surface, and one or more lower layers. The top layer is generally provided with a coating layer and may also be colored. By formulating the layers appropriately, including by adapted softness or by the already mentioned foamed layers, a pleasing haptic effect is obtained, i.e. a pleasingly "soft" feel of the sheet of plastic and also a certain sheen, i.e. certain reflection properties.

Since in the case for example of decorative films, and also in the area of automobile interiors, there is overall a noticeable strong trend toward improving the high-quality impression and toward "functionalization", surfaces of such items are often intended to have particular properties or functions.

In the passenger compartment of a motor vehicle, a large number of functions must and can be controlled by the occupants of the vehicle, for example the air-conditioning system, heating functions, actuation of the window lifters, the setting of mirrors and lamps, music system settings, navigation equipment settings, the operating of communication devices, etc.

Operating these functions generally necessitates a large number of separate controllers, switches and setting buttons etc. that are recessed in the surfaces of for example the dashboard and the door trim as a "Human to Machine Interface (HMI)", which have to be taken into account by the designers in the interior design of the vehicle and often interfere with the design line in the passenger compartment. Moreover, a large number of visible setting possibilities in modern vehicles often looks confusing, and thereby makes intuitive operation more difficult.

The idea of integrating a sensor system into the user interface of items to provide operating functions has already been the subject of some thought. As far as flexible sheets with grained or embossed surfaces are concerned, such as for example imitation leather sheets for the passenger compartment of an automobile, which are not only subjected to extreme strains during production and when they are being applied to the fixed supports but also undergo extremely high temperature fluctuations during operation, the integration of a sensor system is however difficult, and therefore has not so far been adopted in practice.

On the other hand, touch sensors are already established as an HMI in many areas, for example as touch-screen devices on smartphones. Such operating elements or functions make intuitive operation possible while at the same time avoiding mechanical buttons, switches, knobs or dials.

In the case of such touch sensors, resistive and capacitive systems are known. Resistive systems are generally based on two layers with electrically conducting or semiconducting material (often ITO=indium tin oxide), the two layers being spaced apart by a thin layer of air or microdots. Pressure applied to a certain point has the effect that the two layers come into contact and an electrical measuring signal that is transmitted through the lower layer is thereby changed. In this way, the point of contact can be localized. Such systems are standard for rigid applications such as displays of telephones and operating devices. However, applications that are flexible and at the same time extensible cannot be realized in this way.

Capacitive touch sensors are based on a capacitive coupling effect. Suitable coating of a substrate allows a large number of touch sensors that are independent of one another and also allow the simultaneous detection of a large number of points of contact to be realized. Typically, the surface area to be touched is provided with a sensor array, i.e. with an arrangement of a multiplicity of horizontal and vertical sensors, which serve as transmitters or receivers of electrical signals. Such a system is disclosed by US 2006097991 A1, which shows what is known as a "touch panel", which has a transparent capacitive sensor arrangement, which can detect different positions of touches on the operating area or functional area and convert them into signals.

Other sensor devices are likewise known, such as for example sensors that are based on the evaluation of optical signals and reflections in the visible or infrared range. The latter are however only suitable for transparent or translucent touch surfaces. So-called "tactile sensors" are used for example in "artificial skin" for robots or minimally invasive surgery, portable computers, etc., and generally comprise piezo elements or capacitive sensor elements. On account of their physical properties and the way in which they function, piezo elements are however not suitable for extensible and flexible applications. Piezoelectric polymer films, pressure-sensitive conductive rubber, polymers with carbon fibers or conductive polymers are known on a laboratory scale, but because of their only small thickness are only slightly extensible in the application as a membrane, and therefore can only to a limited extent pick up and detect a force.

There have recently also been reports of touch sensors on the basis of "quantum tunnel composites", for example for operating MP3 players or cell phones, which are integrated almost invisibly in clothing. Such systems contain conductive particles in an elastomeric matrix, which however only approach one another under pressure, so that then electrons can tunnel through the elastomeric binder, whereby the system becomes electrically conductive at this point. Without compressive loading, such systems are insulators. The disadvantage of such systems is the necessity for mechanical compressive loading for them to function and the sensitivity to strain, since, when they experience undefined extensions under strain, the tunneling probability of the electrons is also influenced.

Sensors on the basis of conductive textiles are also known. Such sensors are flexible and extensible. However, the conductive textile threads must either be processed in customary textile processing processes (knitting, weaving, etc.), so that only sheet-like individual/separate electrical formations without a user-defined geometry can be produced, or the conductive threads must be stitched onto a textile underlay in a user-defined manner, so that a more complex operation is necessary and the textile evenness is adversely influenced significantly.

The journal Kunststoffe November 2012, page 31 ff, shows components with an integrated sensor system for the passenger compartment of an automobile which are produced on the basis of a sheet of polycarbonate that is scarcely flexible and not extensible. Here it is necessary however for conductive strips and sensor areas to be produced by a complex direct laser process, in that a laser exposes conductive additives in the sheet of plastic. This procedure requires a very complex production of such sheets in a costly multi-stage process. Production "off the roll" is not possible.

U.S. Pat. No. 7,145,432 B2 discloses a pressure-sensitive flexible switching element in sheet form as an operating element (user interface), which has textile-like electrodes, which are arranged over and under a textile element that changes its electrical resistance pressure-dependently. The electrodes detect the change in resistance and thereby generate a signal that can be used in many applications. If, however, such an operating element is stretched onto a support and fixed there under great strain, the switching function is changed or hindered in the stretched regions.

With all of the methods, there has not so far been any satisfactory way of designing a decorative sheet-like material with an integrated sensor system of such flexibility and extensibility that it could be applied to supporting components just as easily as conventional sheets without a sensor system.

Figure 2:
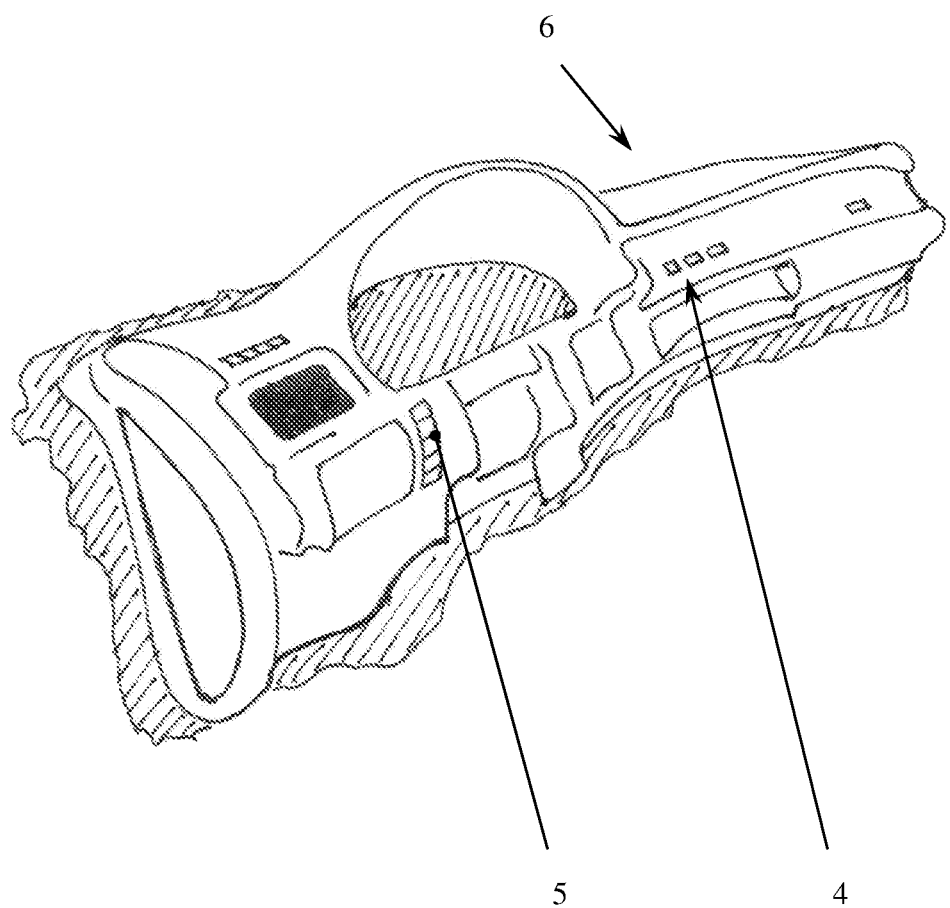

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein, and;

FIG. 1 depicts a flexible and extensible decorative film with integrated layers of conductive polymeric material that cannot be seen from the decorative side which provides a construction/component with which a "touch pad", in accordance with the disclosure; and, FIG. 2 shows an example of configurations of functional surface-area regions integrated on a sheet for a dashboard of a motor vehicle, in accordance with the disclosure.

The object of the invention was therefore that of providing a sheet with an integrated sheet-like switching, sensor or operating element of such flexibility and extensibility that it can be used as a surface or decorative sheet-like material, that is to say for instance as a decorative film with integrated sensor areas in the passenger compartment of a motor vehicle, with which any number of sheet-like switching, sensor or operating elements with different geometries can be incorporated in the sheet without adversely influencing the appearance of the decorative surface, while the switching, sensor or operating functions can be triggered just by lightly touching the decorative film on the switching, sensor or operating areas.

Furthermore, it is intended that the sheet-like materials according to the invention can be produced at low cost and can be processed in customary processing processes for decorative automobile films, such as sewing, upholstering, thermoforming or laminating.

This object is achieved by the features of the main claim. Further advantageous configurations are disclosed in the subclaims.

In this case, at least one layer of conductive polymeric material is arranged in the functional surface-area regions, the layer of conductive material being on the rear side, at a distance from the visible surface of the sheet, and connected by way of contacts/contact electrodes to an electronic open-loop and closed-loop control device, which detects changes of electrical properties of the sheet in the functional surface-area regions and converts them into actuating, switching or control signals.

Therefore, a layer of the polymeric material is conductively formed within the functional surface-area regions, so that the physical properties of the sheet, such as for example extensibility or flexibility, are uniform throughout. This allows the multi-layered composite sheet to be processed and applied to a support as "one" sheet. The switching, sensor or operating elements are already integrated and designed to be ready to connect, thereby largely dispensing with the need for separate switches and internal components. Typically, a window lifter can be operated or an input into an air-conditioning or navigation device can be performed by touching the functional surface-area regions of such a sheet. Functions are therefore operated in an easy and intuitive way.

By achieving the object, therefore, a flexible and possibly extensible decorative sheet-like element or imitation leather is provided, the use of which makes it possible to avoid using for example in the passenger compartment of an automobile switches or controllers that interfere with the overall decorative impression of the sheet or of the passenger compartment.

Moreover, the position of the functional surface-area regions can be freely defined before processing of the sheet. The position of the functional surface-area regions may be made invisible or deliberately visible, in that symbols are deliberately printed on the decorative surface, on the side opposite from the sensor areas. The position of the functional surface-area regions may also be made visible by lighting lying in the sheet or behind the sheet or by projection from an external light source.

An advantageous development is that the layers of polymeric conductive material have the same extensibility as the sheet of polymeric material and are arranged on the rear side of the sheet or within the thickness of the sheet or the material of the sheet. This allows the sheets according to the invention to be pulled onto/applied to supporting structures without any problem, without any appreciable distortion occurring between the functional surface-area regions and the other surface areas. This of course applies to the extensions of up to 300% of the original length that usually occur in the corresponding applications, in particular however to 100% and preferably in the case of extensions of up to 50%.

A further advantageous configuration is that a layer of conductive material designed as a capacitor plate or capacitor sheet is arranged in the functional surface-area regions underneath the visible surface. This allows a particularly sensitive and finely sensing sensor system to be constructed. The same applies to a further advantageous configuration, which is that the layers of conductive material designed as capacitor plates or capacitor sheets are formed as part of an oscillating circuit (LC circuit).

Generally, a capacitor is constructed in such a way that two electrically conductive plates, each with the surface area A, are in plane-parallel arrangement and are separated at a distance d by a dielectric material with a dielectric constant εr. Plane-parallel means here sheet-parallel, i.e. parallel within the thickness of the sheet or the formation of the sheet.

The capacitance of the capacitor is consequently given by the formula:

$$C = \varepsilon r * \varepsilon 0 * A/d$$

where
A=electrode surface area
d=distance between plates
ε0=electric constant
εr=material-specific dielectric constant The principle that the human body has an electrical capacitance, which is manifested by the ability to store electrical energy in comparison with the direct surroundings, is used. This property is already exploited in track pads of laptop computers, touch screens in smart phones and proximity detectors.

In this case, an electrically conductive sensor electrode forms one plate of a capacitor, while the second corresponding capacitor plate is formed by the direct surroundings of the sensor (as a parasitic capacitance) and an additional conductive object (for example an approaching finger) as a touch capacitance. Detection of approach of a body part to the sensor electrode can now take place by the sensor electrode being connected to measuring electronics and the capacitance being measured. When the sensor area is approached by an electrically conductive body, the measured capacitance increases and the connected measuring electronics emit a trigger signal, with which for example an external function can be triggered. As evident from the formula above, the size of the sensor areas, the chosen material that is chosen for the insulation and the distance between the two "plates" are decisive for the sensitivity of the sensor of such a construction.

A further example of such capacitive sensors is that of humidity sensors, which change their capacitance in accordance with the atmospheric humidity. The reading of the capacitance may in principle take place by the measuring of charge curves. However, this cannot be carried out in practice with small capacitances, for which reason in this case usually an oscillating circuit is constructed, the frequency of which is then measured and thus, together with the known inductance of the coil, allows the capacitance of the capacitor to be calculated. However, it is generally the case that the measurement and evaluation of the change in frequency take place in an oscillating circuit that is produced by applying a measuring frequency to the electrically conductive coating.

The sheet-like elements according to the invention may also be used for simply detecting whether there is contact with the surface at all, for example in order to check the occupancy of seats in a motor vehicle. The method is based on the fact that the dielectric sheet-like element with the electrically conductive coating/printing, for example on the rear side, forms a capacitor with the contact area and the electrically conductive layer is connected to a measuring signal, for example to a certain measuring voltage and/or measuring frequency, and to the body of the vehicle as grounding. If there is contact, a capacitive coupling is produced between the contact area of the sheet-like element and the body of the vehicle and the measuring signal is changed in a characteristic manner.

A further advantageous configuration is that a number of layers of conductive material designed as capacitor plates or capacitor sheets are arranged in the functional surface-area regions underneath the visible surface, in particular capacitor plates or capacitor sheets that are insulated from one another by sheet material. This allows the measuring signal to be amplified already when a measuring charge is applied to the plates.

A further advantageous configuration is that the layers of conductive material are designed as antennas, which generate an electric field in the region of the functional surface-area regions.

In this case there is on the rear side, or at least not on the surface of the surface-area element to be touched, which acts as a dielectric, an electrically conductive coating/printing, which is at a distance from at least one further electrically conductive coating. In this case, after applying a measuring signal to it, the one electrically conductive coating acts as a transmitter, which generates an electric field, and the further electrical coating acts as a receiver of the electric field. The field strength at the receiver can be electronically evaluated and is changed by the approach of a body part to the surface of the sheet, and consequently by the approach to the electric field that is produced between the transmitter and the receiver by applying the measuring signal (measuring voltage). Touching contact can consequently be detected. The distance between the electrically conductive surface areas may be provided in one surface area, in that the electrically conductive layer is interrupted or else in that the first electrically conductive layer is provided with a further electrically insulating layer, whereupon an electrically conductive layer is again applied.

A further advantageous configuration is that the sheet-like element is designed as a multi-layered composite sheet, in which the layers of conductive material in the region of the functional surface-area regions consist of an electrically conductive polymer compound, which is applied as a conductive paste to the rear side of the sheet or to layers of the sheet within the composite sheet, preferably by the screen-printing process. The coating or the application advantageously takes place with an amount of between 10 g/m² and 2000 g/m².

The production of the decorative films consequently takes place for example as follows: an imitation leather, consisting of a textile backing and a polymeric single- or multi-layered polymeric coating, for example on the basis of PVC and/or polyolefins and/or polyurethane, is printed with the polymer compound described below on the free textile side that is visible on the rear side.

A woven polyester fabric with a weight per unit area of 47 g/m2 is used as the textile. The coating compound is applied by means of a screen-printing roll with a desired printing pattern to the textile rear side uniformly at the positions, so that the dried compound forms an electrically conductive sensor area.

The applied coating compound according to the invention is applied with a weight of 800 g/m². Subsequently, the coated flexible support is cured in a staged heating process, in that first 80° C. is applied for 2 minutes, then 100° C. for 2 minutes and subsequently 120° C. for 2 minutes. After the drying process, the mass of the applied coating is then about 540 g/m².

The screen used, or the printing thereof, gives the position, geometry and thickness of the sensor areas. The desired rate of application of the electrically conductive polymer compound can be set by way of the coating thickness of the coating of the screen, the screen size, the blade pressure and the viscosity of the electrically conductive paste.

A further advantageous configuration is that the conductive polymer compound contains conductive finely divided metallic and/or metallically coated filler particles, preferably of a dendritic form or core-shell morphology.

In this example, an electrically conductive paste that is prepared in the following way is used: 345 g of an aqueous aliphatic polyester-polyurethane dispersion (with 50% solid content) are homogeneously mixed with 6 g of an associatively acting thickener, 258.75 g of finely divided filler particles of a dendritic form on the basis of superficially silver-coated copper and 86.25 g of finely divided particles of a spherical or elongate form and 5 g of an isocyanate crosslinking agent on the basis of trimeric hexamethylene diisocyanate with a 21.8% content of free isocyanate groups while stirring with a dissolver at 800 revolutions per minute. Optionally, for setting the viscosity, 215 g of distilled water are additionally added here.

The contacting of the electrically conductive sensor areas takes place in the following way: The contact strips, which are provided with a hotmelt adhesive, are prefixed with a smoothing iron or a heated roll or roller and subsequently impregnated by means of a pipette with the same electrically conductive paste over the entire sensor area or only at one position of the sensor area, so that ideally an intimate electrically conductive connection is produced between the conductivity strips and the sensor area.

The conductivity paste is then thermally cured in an oven for 4 minutes at 80° C. and subsequently for 2 minutes at 120° C.

The contacting may also take place by electrically conductive paths being printed with the described conductive paste or some other electrically conductive paste and the contacting taking place at another position of the printed conductive path.

A further advantageous configuration is that the functional surface-area regions can be illuminated from the rear side of the sheet or from the side of the sheet. Consequently, surface-area regions that are also functional in the dark can be easily identified or switched on by lighting up, for example a checkback signal or an input request.

For example, after triggering a function by a sensor area being approached, there may be sensory feedback, for instance by the lighting up of a light at the corresponding point, optical projection of a symbol onto the area, a gentle vibration at the corresponding point (for instance by actuators underneath the sheet or by actuators integrated in the sheet), acoustic signals or a special surface structure (for example a different grain structure than the surroundings or a depression).

It is also possible already when the sensor area is approached for an indication of where the corresponding function is to be operated to be given to the user by measures such as the lighting up of a light at the corresponding point, by a gentle vibration at the corresponding point (for instance by actuators underneath the sheet or by actuators integrated in the sheet). This may be triggered for example by a sensor area that is adjacent to the actual sensor area and is designed to be more sensitive, responds already when approached for example by a hand and for example triggers the illumination of the actual sensor area.

With these properties of the sheet-like element according to the invention, it can be used particularly advantageously for covering surfaces of items in operating areas and/or occupied areas of vehicles, in aircraft, ships, passenger cars and trucks, there in particular for dashboards, seat, wall or door trims, roof liners or armrests.

The sheet-like element according to the invention can be used everywhere where surfaces, functional surfaces and decorative surfaces are to be provided with a sensor system. Thus, any table and seating furniture, fixedly installed or in vehicles and aircraft, ships, etc. bench seats, medical sitting and lying areas, ski-lift and chairlift seats, can also be equipped.

Furthermore, any surface areas in buildings (for example floor mats, floorings, walls, ceilings, etc.) may be equipped with the sheet according to the invention. In particular in floorings, a position detection may for example take place, so that an appropriate application here is in old peoples' homes and care homes. The invention is not restricted to decorative imitation leather or sheet, but can in principle be used in the case of all sheet-like formations that are to be equipped with a sensor system.

The invention may be advantageously used in particular also in medical applications or for sports equipment, since for example in the case of medical furniture, user interfaces, operating tables, etc., openings in the surface for fitting switches and controllers can be avoided, and thus much easier disinfection of the surface is possible.

These sheet-like elements, also the leathers that are possibly used for them, preferably also have a coating, for example for setting the visual impression of the surface, the haptics when touched, the abrasion resistances, the media resistances to cleaning agents and/or scratch resistances. In a preferred embodiment, the sheet-like elements/decorative films described may also be extensible.

In the case of decorative films, the sheet-like elements preferably consist of at least one layer of polymer material based on polyurethanes, PVC, polyolefins, thermoplastic elastomers, thermoplastic polyurethanes or mixtures thereof.

Also possible are multi-layered decorative films, in which one or more layers may be foamed.

As already described above, the decorative films may have textile backings, which for good printability by the screen printing process preferably have a surface that is as planar as possible, such as for example woven fabrics (for example based on polyesters, polyamides, cotton, cotton/polyester blends), microfibre nonwovens or nonwovens densified by a coating. The textiles used may also be calendered under the effect of heat to provide better printability.

Good printability can also be achieved in the case of textile backings with a non-smooth surface, such as knitted fabrics or non-consolidated or scarcely consolidated nonwovens, by them previously being printed or impregnated or adhesively bonded with a polymer sheet.

The solution according to the invention can also be used in the case of/with a wide variety of sheet-like surface materials. Furthermore, non-decorative films may also be provided in the way described, for example to represent proximity sensors or position sensors in floorings, etc.

As mentioned above, for providing the printed electrically conductive materials, in particular the electrically conductive imitation leathers, electrically conductive pastes are advantageously used, making good flexibility and extensibility of the flexible sheet-like formations possible after drying. However, in principle any electrically conductive paste may be used, and in particular those electrically conductive pastes that can be processed by the screen-printing process. Such pastes are described for example in EP 2 457 944 A1.

Depending on the application, printing patterns and sensor areas can vary within wide limits for optimizing and setting the electrical capacitance. The form of the sensor area may also have various geometrical forms for certain applications, or for example also be bent. In particular also when slide controls are to be provided by a capacitive sensor system, sensors may be arranged in a linear row or else in a bent form (array). The sensors arranged one after the other may for example also be intermeshed with one another, without touching however.

For better shielding of the layers of conductive polymer material in the functional surface-area regions, shielding electrodes may also be printed alongside. Furthermore, for shielding and/or improving the sensitivity of the sensors, it is also possible to incorporate additional electrically conductive layers, which however are separated from the actual sensor area by an insulating layer. This can be realized by for example applying an insulating polymer layer to the sensor area, for example by the screen-printing process, whereupon in turn the next electrically conductive layer is applied by the screen-printing process and can then for example be grounded.

The contacting of the sensor areas may take place in the way described above or else by the contacting electrodes connected to the sensor areas likewise being printed, and the transition to the measuring electronics taking place at a different location of the printed contacting electrode.

The sensitivity of the integrated sensor system may be set, for example by variation of the electrical resistances used, such that even an approach to the sensor area without direct contact of the surface can be detected. In this way it is easily possible for example to realize a control of functions by performing simple gestures in front of the surfaces of the sheet.

It has also been described above that, for better operability of the sensor functions, a printing of the decorative surface can optionally take place. This may take place by customary printing processes, such as screen printing, inkjet printing or else flexographic printing.

Therefore, the sheet-like material according to the invention provides a flexible, decorative imitation leather with integrated sensor areas, including for use in vehicles, that is visually indistinguishable from a decorative film without such a sensor system. The possibilities for interior design are significantly improved by making it possible to avoid actuating and functional switches and controllers, while retaining the applicability of customary processing processes for decorative automobile sheets, such as sewing, upholstering, thermoforming or laminating.

The decorative sheet-like material as defined by the invention may therefore be a single- or multi-layered polymeric sheet, in the case of the multi-layered sheet it being possible for one or more layers to be one or more textile sheet-like formations and/or foamed sheet-like polymeric layers such as polyurethane- or polyolefin-based foams. A decorative sheet-like material as defined by the invention may also be a textile sheet-like formation with a textile surface or else a leather. These sheet-like formations may also be of a multi-layered construction, it being possible for foamed polymer layers and/or textile layers to be present as further layers. In the case of leather, the leather may also have one or more additional polymeric layers on the surface. These layers may also have a surface structure or grain structure.

The invention is to be explained in greater detail on the basis of exemplary embodiments. To present the sheet according to the invention, two demonstrators were constructed. The Arduino platform as a microcontroller and the associated software were used as the component making up the electronics. However, various I/O boards with a microcontroller, which depending on the task can be programmed on the basis of an open-source software, available in a library, in a C/C++-based programming language, may be used as the hardware.

The available boards may be used as an electronic evaluation circuit for a capacitive sensor system. In this case, various pins of the board are defined as capacitive sensors which can measure the electrical capacitance of the human body. The pins thus defined must be connected to the sensor area by way of a medium to high electrical resistor. The change in capacitance when a human body part approaches is measured.

This takes place by the microcontroller transmitting an electrical signal by way of the electrical resistor to the "send" pin, which is connected to a sensor area. In this case, the time or delay until the corresponding signal is detected at the "receive" pin is measured.

Even if the sensor area is covered with a non-conducting material, the electronic signal evaluation works. The signal emitted by the send pin is determined by an RC time constant, which is formed by the product of the electrical resistance R and the capacitance C, consisting of the sum of the capacitance at the receive pin and the additional capacitance that is produced by interaction of the sensor area for example with the human body. Depending on the desired sensitivity of the sensor, the electrical resistance should be chosen between 1 megohm (activation when the surface is touched) and about 40 megohms (activation already possible when the surfaces are approached; to a distance of about 1 m). For error-free functioning of the sensor demonstrators, sufficient grounding of the switch electronics is essential and/or in addition possibly also by a non-conducting material, a second electrically conductive sheet that is at a distance from the sensor area and is likewise grounded.

In a circuit taken as an example, it was possible with the aid of the flexible and extensible decorative film according to the invention, with integrated functional surface-area regions that cannot be seen from the decorative side, to provide a sensor and operating element with which a servomotor was controlled in a specifically selective manner. Such a construction, given to illustrate the principle, allowed for example a window lifter in the side of a door of a motor vehicle to be operated.

The production of the decorative film, in which two sensor areas that cannot be seen from the decorative side are integrated, takes place in the way described above. Two square areas with a side length of 2 cm are printed onto the textile rear side by means of a screen-printing process with the electrically conductive paste described above, the squares having a center-to-center spacing of 10 cm. The paste is applied in such a thickness that the resultant layer thickness of the printed layer after drying is about 30 µm. The contacting takes place in the way described above, by the contact strip being placed centrally on the printed sensor area and, after prefixing, impregnation with the conductive paste and drying, having an intimate contact area of about 1 $cm^2$ in relation to the sensor area. The imitation leather is fixed on a component support by laminating, so that the decorative surface is visible and the contact strips are connected to the aforementioned microcontroller, to be specific the sensor areas are respectively connected to one another by way of an electrical resistance of 1 megohm. Furthermore, the corresponding terminals are connected to a servomotor. The microcontroller is then correspondingly programmed with the associated software.

After connecting the microcontroller to a PC-USB terminal for supplying power, the servomotor can be controlled as desired by lightly touching the finished component on the corresponding invisible sensor areas. The decorative area is in this case identical in its appearance in comparison with a decorative film that is not equipped with sensor areas and is flexible, so that even quite strong loads, such as the forceful placement or pressing on of a body part, do not influence the sensor function. Even when there is strong manual pressing of the sheet, the function of the sheet is retained.

A further configuration that is advantageous and presented here by way of example is that the functional surface-area regions form multiple arrangements (arrays), and consequently allow a position detection.

For this, a further example showed on the basis of FIG. 1 how by the application of the flexible and extensible decorative film with integrated layers 3 of conductive polymeric material that cannot be seen from the decorative side it is possible to produce a construction/component with which a "touch pad", i.e. an operating panel 1 provided with numbers, can be realized, with which for example specific inputs into devices can be performed by way of the decorative surface.

In this case, the position of the points of the imitation leather to be touched were made visible by an imprint of Arabic numerals on the functional surface-area regions 2 on the decorative surface. Square areas each with a side length of 2 cm were printed onto the textile rear side by means of a screen-printing process as layers 3 of conductive polymeric material with the electrically conductive paste described above, the squares on the rear side locally coinciding with the imprint of the numerals/functional surface-area regions 2 located on the surface.

After connecting the microcontroller to a PC via the USB interface for supplying power, the operating panel 1 can be operated as desired by lightly touching the finished component on the corresponding functional surface-area regions 2, so that the corresponding characters appear on a display. The decorative area is in this case identical in its appearance in comparison with a decorative film that is not equipped with sensor areas and is flexible, so that even quite strong loads, such as the forceful placement or pressing on of a body part, do not adversely influence the sensor function. Even when there is strong manual pressing of the sheet, the function of the sheet is retained and the sensor areas could not be felt.

FIG. 2 shows once again by way of example the arrangement of other configurations of functional surface-area regions 4 and 5 integrated on a sheet according to the invention for a dashboard 6 of a motor vehicle.

LIST OF REFERENCE SIGNS

Part of the Description 1 operating panel
2 functional surface-area region
3 layer of conductive polymeric material
4 functional surface-area region
5 functional surface-area region
6 dashboard

The invention claimed is:

1. A flexible sheet-like material formed of a polymeric material and having a surface with a grain structure or embossing, the sheet-like material comprising one or more functional surface-area regions which are designed in the form of one or more of a switching, a sensor or an operating element, wherein at least in a portion of the functional surface-area regions the sheet-like material is of a multi-layered design;

wherein at least one layer of conductive polymeric material is disposed in the functional surface-area regions at least proximate an opposing side of the flexible sheet-like material from the surface, wherein the at least one layer of conductive polymeric material is disposed at a distance from the surface of the sheet-like material, and wherein the at least one layer of conductive polymeric material is connected to an electronic open-loop and closed-loop control device, which detects changes of electrical properties of the sheet in the functional surface-area regions and converts them into actuating, switching or control signals;

wherein the flexible sheet-like material is constructed as a multi-layered composite sheet, in which the layers of conductive material in the region of the functional surface-area regions comprise an electrically conductive polymer compound, which is applied as a conductive paste to the rear side of the multi-layered composite sheet or to layers of the multi-layered composite sheet, by a screen-printing process;

wherein the at least one layer of conductive polymeric material serves as one of a capacitor plate or capacitor sheet arranged in the functional surface-area regions underneath the surface; and, wherein the at least one layer of conductive polymeric material is a plurality of layers of conductive polymeric material, and wherein the a plurality of layers of conductive polymeric material are insulated from one another by a sheet material.

2. The flexible sheet-like material as claimed in claim 1, wherein the at least one layer of conductive polymeric material has the same extensibility as the polymeric material, and wherein the at least one layer of conductive polymeric material is arranged on the rear side of the sheet or within the thickness of the flexible sheet-like material.

3. The flexible sheet-like material as claimed in claim 1, wherein the at least one layer of conductive material is as part of an oscillating circuit.

4. The flexible sheet-like material as claimed in claim 1, wherein the at least one layer of conductive material is an antenna which generates an electric field in the region of the functional surface-area regions.

5. The flexible sheet-like material as claimed in claim 1, wherein the at least one layer of conductive material is a coating screen printed in an amount of between 10 g/m$^2$ and 2000 g/m$^2$.

6. The flexible sheet-like material as claimed in claim 1, wherein the conductive polymer compound comprises conductive finely divided metallic and/or metallically coated filler particles.

7. The flexible sheet-like material as claimed in claim 1, wherein the functional surface-area regions form multiple arrangements.

8. The flexible sheet-like material as claimed in claim 1, wherein the functional surface-area regions can be illuminated from the rear side of the flexible sheet-like material or from the side of the flexible sheet-like material.

9. The flexible sheet-like material as claimed in claim 1, installed as one or more covering surfaces in operating areas and/or occupied areas of vehicles.

10. The flexible sheet-like material as claimed in claim 1, installed in one or more surface areas of a building.

* * * * *